United States Patent [19]

Tsutsui et al.

[11] Patent Number: 5,032,531
[45] Date of Patent: Jul. 16, 1991

[54] METHOD OF MANUFACTURING ACTIVE MATRIX PANEL

[75] Inventors: Ken Tsutsui, Tokyo; Toshihisa Tsukada, Musashino; Hideaki Yamamoto, Tokorozawa; Yasuo Tanaka, Koganei; Haruo Matsumaru, Tokyo, all of Japan

[73] Assignee: Hitachi, Ltd., Tokyo, Japan

[21] Appl. No.: 376,866

[22] Filed: Jul. 7, 1989

[30] Foreign Application Priority Data

Jul. 8, 1988 [JP] Japan ................. 63-168853

[51] Int. Cl.⁵ .......................... H01L 21/265
[52] U.S. Cl. ...................... 437/40; 437/181; 437/51; 437/59; 357/23.7; 350/332
[58] Field of Search ........... 437/40, 181, 51, 59; 350/332, 333, 336; 357/23.7

[56] References Cited

U.S. PATENT DOCUMENTS

| | | | |
|---|---|---|---|
| 4,728,175 | 3/1988 | Baron | 350/333 |
| 4,736,229 | 4/1988 | Holmberg et al. | 357/23.7 |
| 4,778,258 | 10/1988 | Parks et al. | 350/333 |
| 4,778,560 | 10/1988 | Takeda et al. | 437/181 |
| 4,821,092 | 4/1989 | Noguchi | 357/23.7 |
| 4,933,296 | 6/1990 | Parks et al. | 437/40 |
| 4,935,792 | 6/1990 | Tanaka et al. | 357/45 |
| 4,943,143 | 7/1990 | Yamashita | 350/333 |

FOREIGN PATENT DOCUMENTS

| | | | |
|---|---|---|---|
| 0189970 | 9/1985 | Japan . | |
| 0168224 | 7/1986 | Japan | 437/181 |
| 0009977 | 1/1988 | Japan . | |

*Primary Examiner*—Brian E. Hearn
*Assistant Examiner*—Trung Dang
*Attorney, Agent, or Firm*—Antonelli, Terry, Stout & Kraus

[57] ABSTRACT

In a first manufacturing step of an active matrix liquid-crystal panel, a transparent conductor film and a metal film are sequentially accumulated on a substrate in this order so as to form a two-layer film. The two-layer film including the transparent conductor film and the metal film is subjected to photoetching to simultaneously form at least a pixel electrode (transparent conductor film) and a gate electrode (metal film) of a thin-film transistor according to a predetermined pattern. In a fabrication process near the end of the fabrication, when the source and drain electrodes of the thin-film transistors are formed, the metal film on the pixel electrode is simultaneously removed. Since the removal of the metal film protecting the pixel electrode is simultaneously achieved at a point near the final process, protection of the pixel electrode is guaranteed, thereby realizing improvement of the yielding and reduction of the production process.

19 Claims, 10 Drawing Sheets

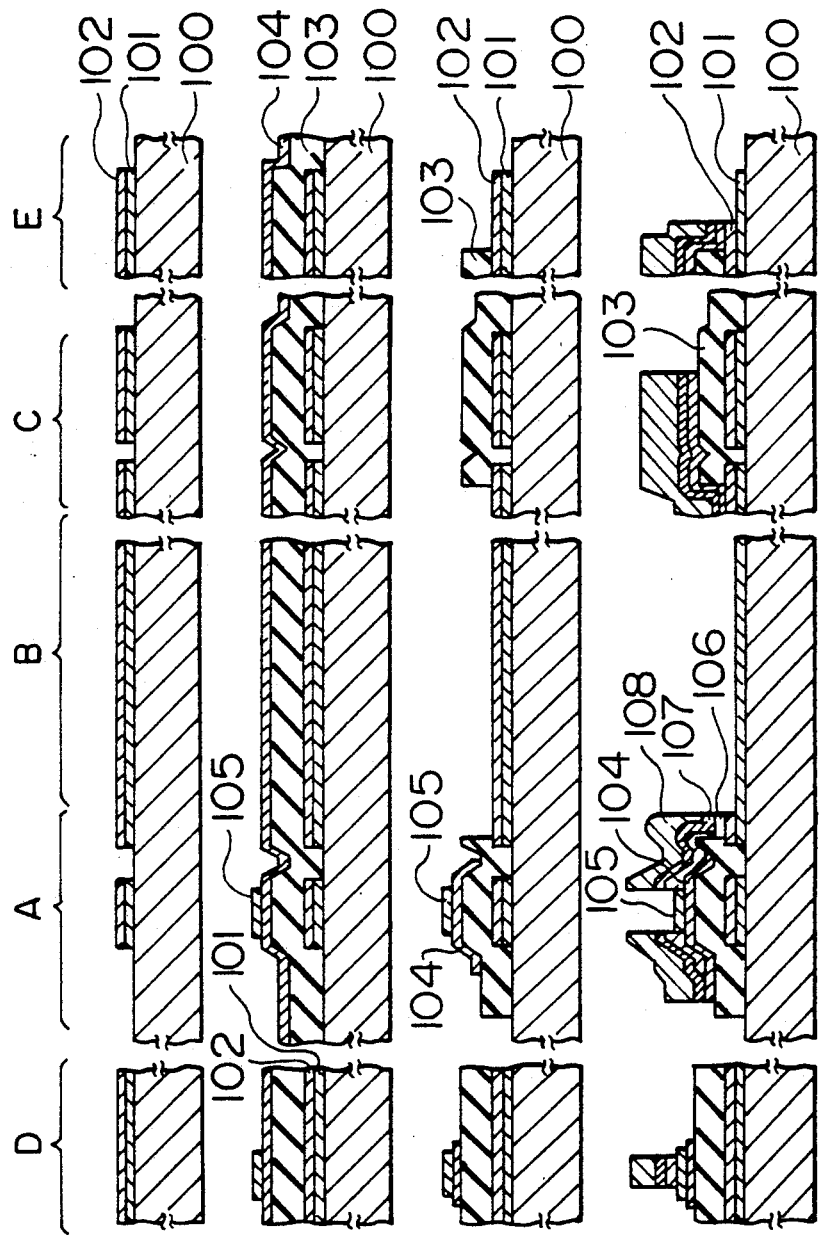

METHOD OF MANUFACTURING ACTIVE MATRIX PANEL

BACKGROUND OF THE INVENTION

The present invention relates to a liquid crystal display panel of an active matrix type, and in particular, to a method of manufacturing an active matrix panel employing an amorphous silicon thin-film transistor.

Conventionally, an active matrix panel includes a thin-film transistor (TFT) having a structure described, for example, in the JP-A-60-189970 or JP-A-63-9977.

However, in the JP-A-60-189970, although the construction of the JP-A-60-189970 is identical to that of the present invention in a point that a channel protective film is consecutively formed so as to follow a gate insulation film and a semiconductor film, description has not been given of a reduction of the process step by employing a self-alignment in association with work of the respective layers. Based on the drawings thus disclosed, there are effected several operations of photolithography and hence there is required a long process, which leads to a problem of productivity.

Moreover, also in the JP-A-63-9977, the constitution is equal to that of the present invention in that the gate electrode and the pixel electrode are formed at the same time; however, an operation to remove a metal film disposed on the pixel electrode is simultaneously achieved when a work is conducted on the gate insulator film by use of the self-alignment. In consequence, a surface of the pixel electrode (transparent conductor film) is likely to be subjected to a quality change (to increase resistance) through various kinds of processing. Since the metal film on the pixel electrode also serves as a protective film, the removal of the metal film is desirably accomplished in a process to be effected as late as possible. Furthermore, the channel protective film is not successively formed in the structure of the thin-film transistor described in this article.

As described above, according to the prior art technology, considerations have not be given so as to produce the active matrix panel through a simple process with a high productivity. Development of the market of the liquid-crystal display can be achieved by a technology which enables a large amount of active matrix panels (to be simply referred to as a panel herebelow) to be produced at a lower cost. In consequence, improvement of the yielding in the panel production and minimization of the production process step have been essential problems to be solved. Although not described in the prior technologies above, the panel requires, in addition to the thin-film transistor portion, such functional units as a pixel electrode section, an additional capacity portion, a wiring intersection portion of double layer, and a terminal portion. For these functional sections, a lower conductor film, an upper conductor film, an insulation film, a semiconductor, a doped semiconductor containing impurity, and/or a protective film are/is required to be disposed if necessary.

SUMMARY OF THE INVENTION

It is therefore an object of the present invention to provide a method of manufacturing an active matrix panel in which creation of functional sections is further simplified, and specifically, these functional sections are produced by use of a reduced number of photoresist masks so as to shorten the production process, thereby improving the yield and productivity in a mass production.

The object above can be achieved by effecting work on the respective sections of the greater number of functional units through a work process. In more detail, there is effected a panel manufacturing method in which two films including a transparent conductor film and a metal film accumulated in this order on a substrate are subjected to a work (e.g., photoetching) by use of a photoresist mask so as to conduct simultaneously a patterning at least of a pixel electrode and a gate electrode of a thin-film transistor such that when a process step employing a photolithography to form a source electrode and a drain electrode of the thin-film transistor is effected, a metal film on the pixel electrode is removed in such processing step to form the source and drain electrodes; or, in addition, there is employed a method in which at the same time of the photoetching process to form the source and drain electrodes, the metal film on the pixel electrode, an unnecessary portion of doped amorphous silicon film accumulated below the source wiring layer of the thin-film transistor, and an unnecessary portion of doped amorphous silicon film piled above the gate insulation film are removed, thereby achieving the object above.

First, in order to effect a simultaneous photoetching of the pixel electrode and the gate electrode of the thin-film transistor, a transparent conductor film is piled on the substrate for the pixel electrode; subsequently, a metal film is manufactured for the gate electrode, thereby simultaneously forming the pixel electrode, the scanning line, and the gate electrode. By achieving a patterning operation on the two films by use of a sheet of photoresist mask, it is possible to reduce the number of required photoresist masks by one.

Conversely, there remains a metal film on the pixel electrode, and the resultant film becomes to be opaque. In this situation, if the metal film is immediately removed to manufacture a transparent pixel electrode, there may possibly arise a problem that the pixel electrode loses a resistive feature in the subsequent process and is hence melted down in some cases. To overcome this difficulty, the metal film on the transparent conductor film is kept, so that the metal film functions to protect the transparent conductor film in the processes to be carried out later. Furthermore, the metal film on the pixel electrode is removed in the same processing step, using a same photoresist mask, when the source and drain electrodes of the thin-film transistor are processed by use of a photoresist mask in a process step near the panel fabricating process, thereby removing the metal film without increasing the number of processes. Moreover, in addition, by simultaneously removing the unnecessary portions such as the doped amorphous silicon film and the amorphous silicon film piled on the gate insulation layer for manufacturing the thin-film transistor, there is substantially achieved a self-alignment so as to reduce the number of photoresist masks and process steps, which improves the yield in the mass production of the panel.

According to the present invention, there are employed four to six photoresist masks to fabricate the functional sections necessary for the liquid-crystal display panel such as a thin-film transistor portion, a pixel electrode section, an additional capacity portion, a wiring intersection portion, and a terminal portion. That is, there is formed a two-layer structure including a transparent conductor film and a metal film, which is then subjected to a process by use of a sheet of photoresist mask so as to conduct a simultaneous patterning of a gate electrode, a pixel electrode, and a scanning line, and an additional capacity lower electrode, thereby reducing the number of required photoresist masks. In addition, at the same time of the photolithographic etching of the upper source and drain electrodes, by removing the doped semiconductor, the semiconductor, and the metal film on the transparent conductor film as the pixel electrode, there can also be reduced the number of the required photoresist masks; moreover, there is attained a satisfactory effect that the metal film on the transparent conductor film serves as a protective film in the intermediate process steps. As described above, a plurality of functional sections are formed by use of a sheet of photoresist mask and a self-alignment process method is employed so as to minimize and to simplify the processes, thereby achieving improvement of the yield and productivity in a mass-production line.

BRIEF DESCRIPTION OF THE DRAWINGS

These and other objects and advantages of the present invention will become apparent by reference to the following description and accompanying drawings wherein:

FIGS. 3a-3d are schematic diagrams showing a process flow useful to explain second and sixth embodiments according to the present invention;

DESCRIPTION OF THE PREFERRED EMBODIMENTS

Figures 1A, 1B, 1C, 1D:
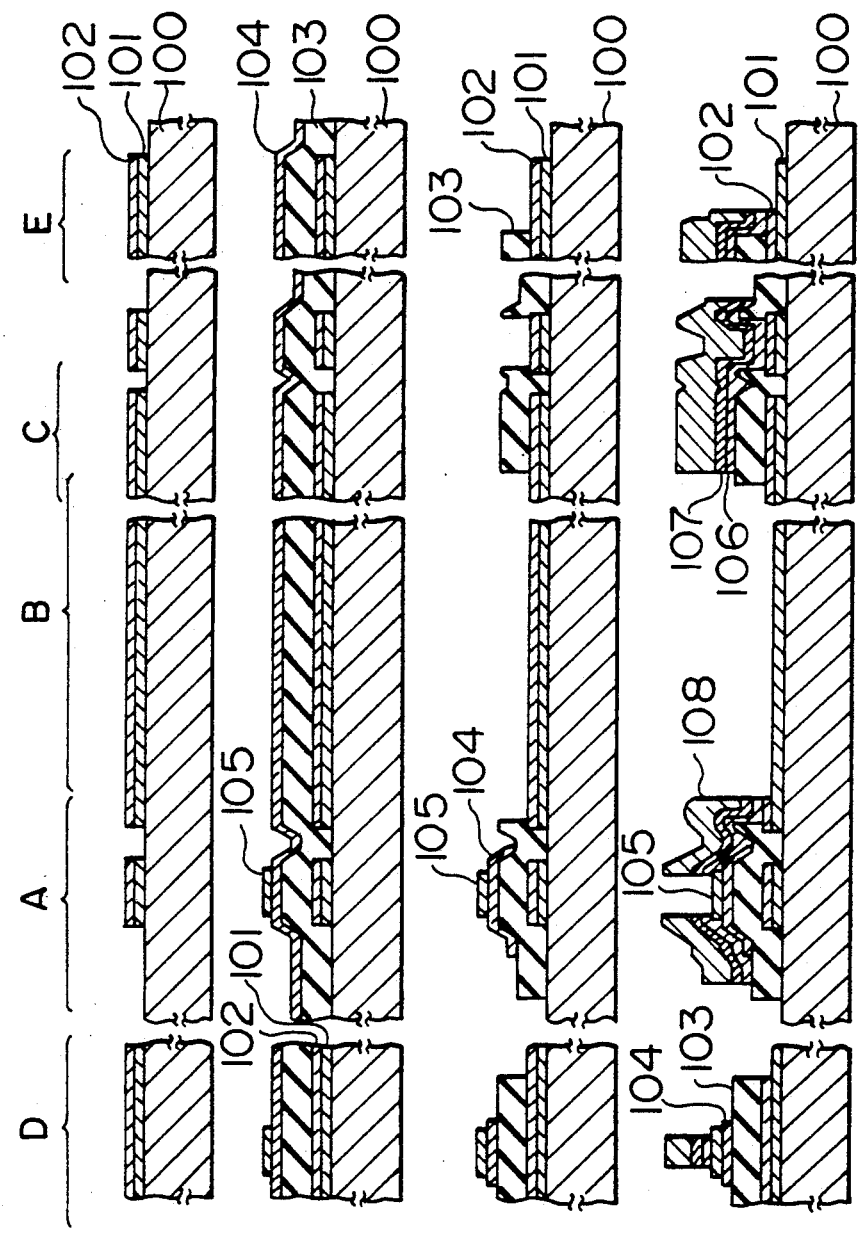
FIGS. 1a-1d are schematic diagrams showing a process flow useful to explain first and third embodiments according to the present invention.

Referring now to the drawings, description will be given of embodiments according to the present invention.

Embodiment 1

Figure 2A:
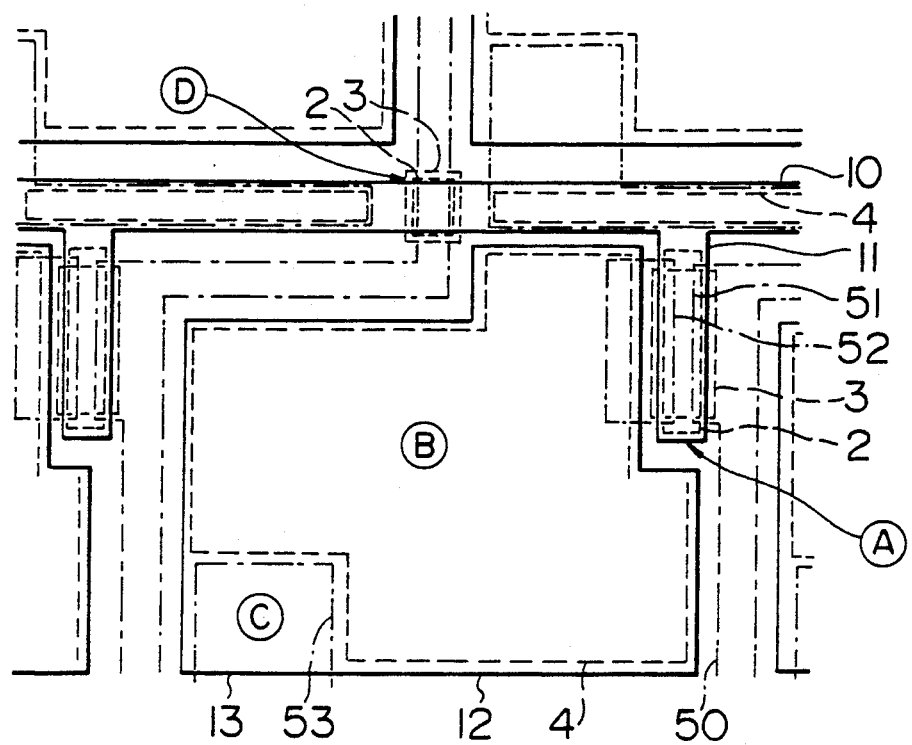
FIG. 2(a) is a plan view showing a panel of FIG. 1(d)
Figure 2B:
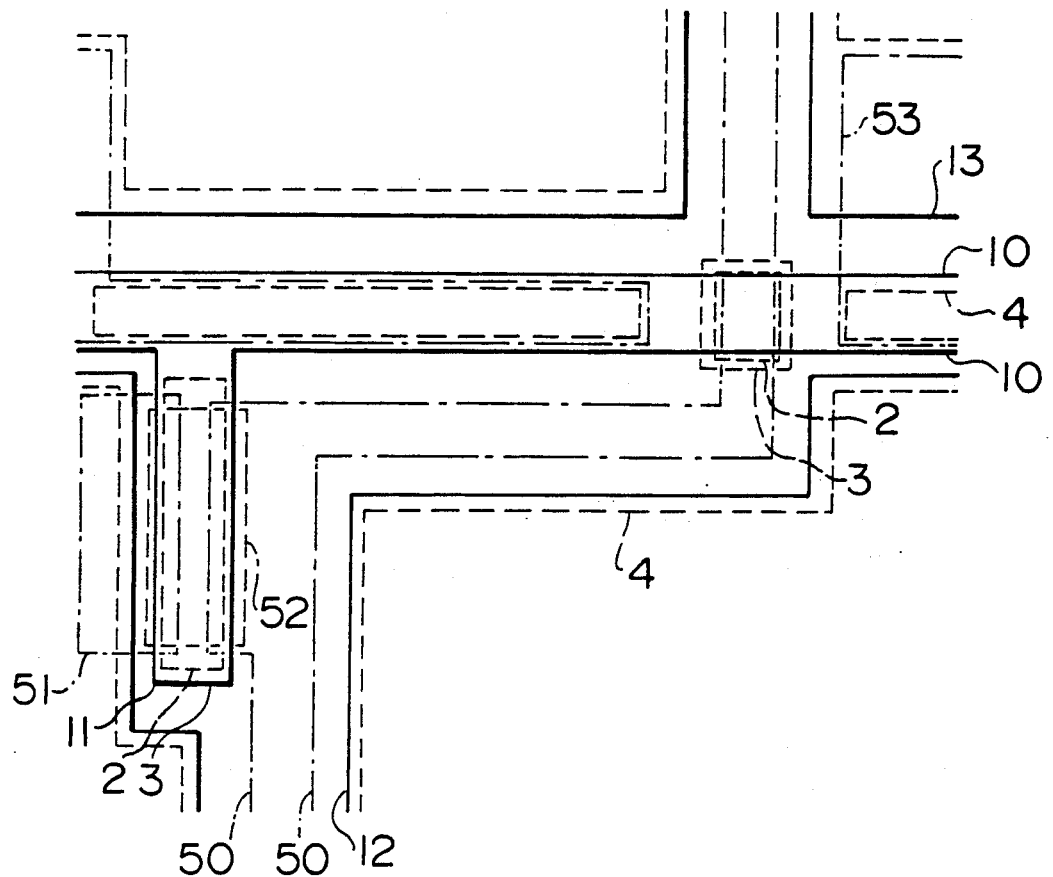
FIG. 2(b) is a magnified view showing a portion of 2(a)

FIGS. 1d-1d show a process flow of a first embodiment according to the present invention. FIG. 2a is a plan view of a panel implemented according to the first embodiment; whereas a portion (b) shows a magnified view of a portion of (a) of FIG. 2. The panel includes a thin-film transistor section A, a pixel electrode section B, an additional capacity section C, a wiring intersection portion D, and a terminal section E. These functional sections are formed in a sequential fashion. First, as shown in (a) of FIG. 1, on a glass substrate 100, there is piled as a transparent conductor film 101, for example, a film of oxide of indium titanate (ITO) with a film thickness of 80 nanometers (nm) and then a lower conductor film 102 is formed by applying a chromium (Cr) film with a thickness of 100 nm such that these two films are subjected to an ordinary photoetching process by use of a photoresist mask. Through this work process, there are formed in the thin-film transistor section A a gate electrode 11 (FIG. 2), a pixel electrode 12, a scanning line 10, and an additional capacity lower electrode 13. Second, as shown in (b) of FIG. 1, according to a chemical vapor deposition (CVD) method, there are formed an insulation film 103, for example, a film of SiN having a thickness of 300 nm, a semiconductor layer 104, for example, of an amorphous silicon (to be abbreviated as a-Si herebelow) with a thickness of 50 nm, and a protection film 105, for example, a SiN film having a thickness of 200 nm. Thereafter, the protective film 105 is worked through a photoresist etching process by use of a second photoresist mask. In this work process, the protective film 105 is kept so as to possess a width narrower than the gate electrode 11 of the thin-film transistor portion A; moreover, there is kept the protective film 105 in the wiring intersection portion D. As a result of this process, the protective film 2 is fabricated as shown in FIG. 2. Third, as can be seen from (c) of FIG. 1, the semiconductor layer 104 is processed by use of a third photoresist mask such that the semiconductor layer 104 is kept to be broader than a width of the gate electrode 11 in a direction of a channel length and to be shorter than the gate electrode 11 in a direction of a channel width and that the semiconductor layer 104 is also kept in the wiring intersection portion D. Furthermore, the insulation film 103 is worked by means of a fourth mask. In this process, the insulation film 103 is removed from the regions related to a portion of the scanning line 10, the terminal section E, and the pixel electrode section B, the processed areas being slightly narrower than the respective sections. Fourth, as shown in (d) of FIG. 1, there is formed a doped semiconductor film 106 containing an impurity, for example, an amorphous silicon film with a thickness of 50 nm and containing phosphorus with a concentration of 1% according to the CVD method. Subsequently, an upper conductor film (I) 107 is formed, for example, a chromium film having a thickness of 100 nm, through a sputtering operation and then an upper conductor film (II) 108 is produced, for example, an aluminum film having a thickness of 500 nm, by sputtering. Thereafter, these three layers including the aluminum film, the chromium film, and the amorphous silicon film containing phosphorus are subjected to an etching by use of a fifth photoresist mask. In this etching process, step in the thin-film transistor section A, the three layers are kept in association with a drain electrode 51 and a source electrode 52; in the pixel electrode section B, the three layers are removed from regions other than a contact section of the source electrode 52 and then the lower electrode film 102 is subsequently removed; and in the additional capacity section C, the additional capacity upper electrode 53 is kept so as to cover a contact hole over the scanning line 10 to establish an electric connection. As is clear from the foregoing, the removal of the lower electrode film 102 in the pixel electrode section B is performed by etching, using as the mask the photoresist mask used for forming the source electrode 52 and the drain electrode 51. The formed source and drain electrodes, and the insulation film 103, have an opening whose area is slightly smaller than the pixel electrode area, and the lower electrode film 102 in the opening is removed by extending the etching treatment time so as to etch the lower electrode film exposed in the opening in the pixel electrode section, without using a new photoresist mask. Moreover, the signal line 50 is kept so as to form a two-layer wiring in the wiring intersection portion D. In the terminal section E, the work process of the three films is carried out such that the transparent conductor film 101 appears in an external connection section, thereby attaining a panel shown in (d) of FIG. 1 and FIG. 2. Thereafter, there are formed a passivation film and an orientation film as necessary; however, the manufacturing method of the display panel to be accomplished after this point is not related to the gist of the present invention and hence description thereof will be omitted. In the first embodiment, five photoresist masks are employed for the production.

Embodiment 2

Figure 4:
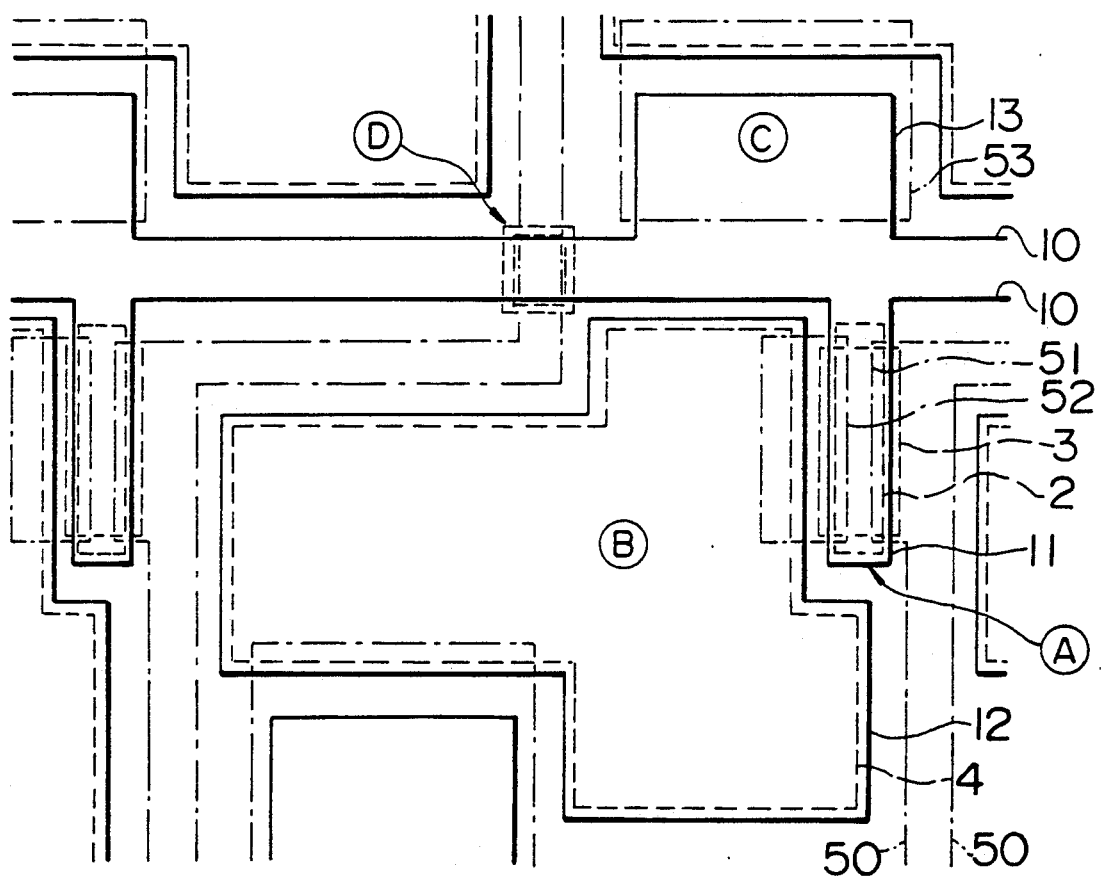
FIG. 4 is a plan view showing a panel of FIG. 3(d)
Figure 5:
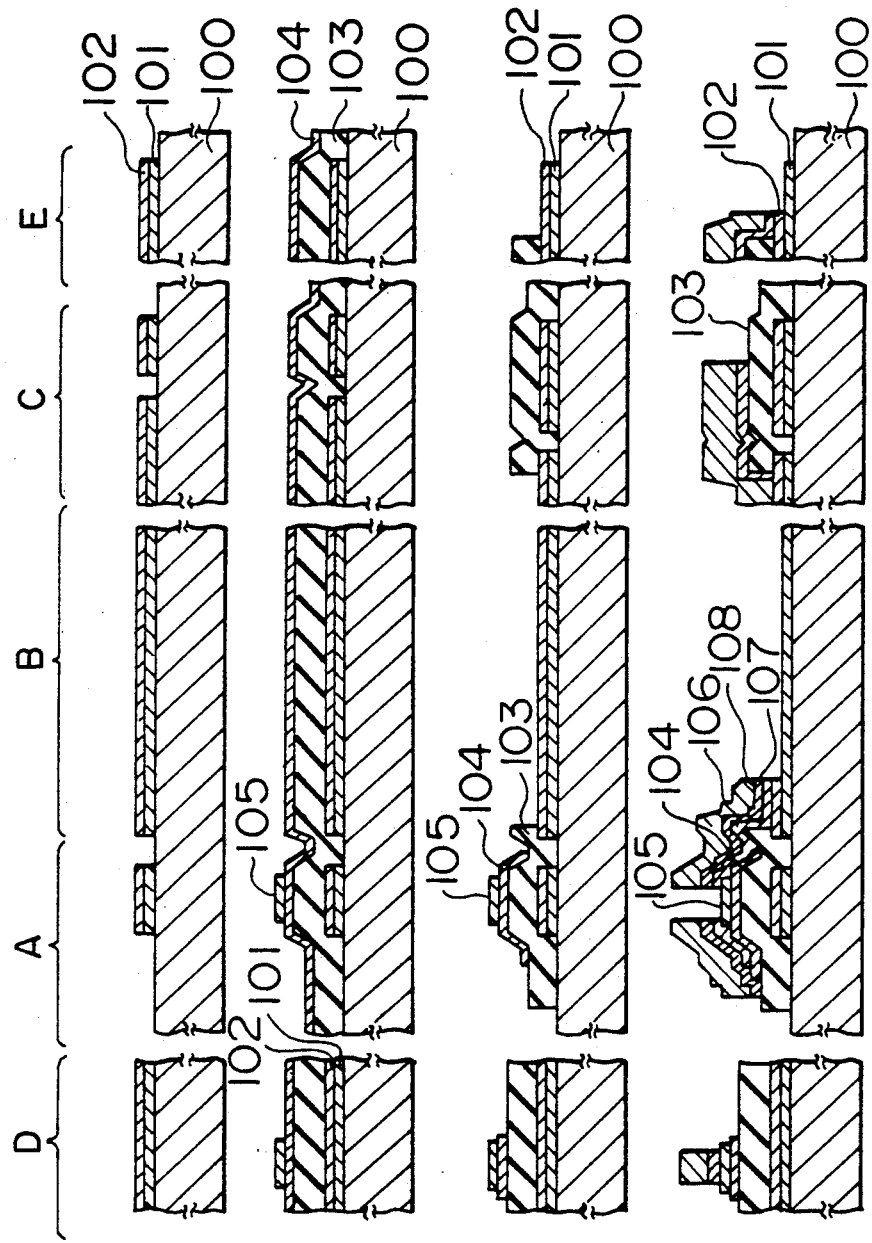
FIGS. 5a-5d are schematic diagrams showing a process flow useful to explain a fourth embodiment according to the present invention.

Description will be given of the second embodiment according to the present invention with reference to FIGS. 3a–3d and FIG. 4. First, as shown in (a) of FIG. 3, on a glass substrate 100, there is piled as a transparent conductor film 101, for example, a film of an oxide of indium titanate (ITO) with a film thickness of 80 nanometers (nm) and then a lowest conductor film 102 is formed thereon, for example, a chromium (Cr) film having a thickness of 100 nm, such that these two films are subjected to an ordinary etching process by use of a photoresist mask. Through this work process, there are formed in the thin-film transistor section A a gate electrode 11 (FIG. 4), a pixel electrode 12, a scanning line 10, and an additional capacity lower electrode 13. Second, as shown in (b) of FIG. 3, by use of a chemical vapor deposition (CVD) method, there are formed an insulation film 103, for example, a film of SiN having a thickness of 250 nm, a semiconductor layer 104, for example, of an amorphous silicon with a thickness of 30 nm, and a protection film 105, for example, a SiN film having a thickness of 250 nm. Thereafter, the protective film 105 is photoetched by use of two photoresist masks. In this process, the protective film 105 is kept so as to have a width narrower than the width of the gate electrode 11 of the thin-film transistor portion A; moreover, the protective film 105 is retained in the wiring intersection portion D. As a result of this process, the protective film 2 is fabricated as shown in FIG. 4. Third, as can be seen from (c) of FIG. 3, the semiconductor layer 104 is processed by use of a third photoresist mask such that the semiconductor layer 104 is kept to be broader than a width of the gate electrode 11 in a direction of a channel length and to be shorter than the gate electrode 11 in a direction of a channel width and that the semiconductor layer 104 is also kept remained in the wiring intersection portion D. Furthermore, the insulation film 103 is photoetched by means of a fourth mask. In this process, the insulation film 103 is removed from the regions associated with the terminal section E and the pixel electrode section B, the processed areas being slightly narrower than the respective sections. Fourth, as shown in (d) of FIG. 3, there is formed a doped semiconductor film 106 containing impurity, for example, an amorphous silicon film with a thickness of 40 nm and containing phosphorus with a concentration of 0.8%, according to the CVD method. Subsequently, an upper conductor film (I) 107 is formed, for example, a chromium film having a thickness of 80 nm, through a sputtering operation, and then an upper conductor film (II) 108 is produced, for example, an aluminum film having a thickness of 400 nm, by sputtering. Thereafter, these three layers are subjected to a etching process by use of a fifth photoresist mask. In this process, in the thin-film transistor section A, the three layers are kept in association with a drain electrode 51 and a source electrode 52; in the pixel electrode section B, the three layers are removed from regions other than a contact section of the source electrode 52 and a contact section of the additional capacity upper electrode 53 and then the lower electrode film 102 is subsequently removed; in the additional capacity section C, the additional capacity upper electrode 53 is kept and then the signal line 50 is kept; and in the wiring intersection portion D, the two-layer wiring is formed. Furthermore, in the terminal section E, photoetching of the three films is carried out such that the transparent conductor film 101 appears in an external connection section, thereby attaining a panel shown in (d) of FIG. 3 and FIG. 4. In the second embodiment, five photoresist masks are employed for the production.

Embodiment 3

Description will be given of the third embodiment to the FIGS. 1a–1d and FIG. 2. First, as shown in (a) of FIG. 1, on a glass substrate 100, there is formed as a transparent conductor film 101, for example, a film of an oxide of indium titanate (ITO) with a film thickness of 70 nm, and then a lower conductor film 102 is formed, for example, a chromium film having a thickness of 120 nm, these two films undergo an ordinary etching process by use of a photoresist mask. Through this work process, there are formed in the thin-film transistor section A a gate electrode 11 (FIG. 2), a pixel electrode 12, a scanning line 10, and an additional capacity lower electrode 13. Second, as shown in (b) of FIG. 1, based on the chemical vapor deposition (CVD) method, there are formed an insulation film 103, for example, a film of SiN having a thickness of 280 nm, a semiconductor layer 104, for example, of an amorphous silicon with a thickness of 40 nm, and a protection film 105, for example, a SiN film having a thickness of 300 nm. Thereafter, the protective film 105 is photoetched by use of a second photoresist mask. In this work process, the protective film 105 is kept so as to have a width narrower than the width of the gate electrode 11 of the thin-film transistor portion A; moreover, the protective film 105 is remained also in the wiring intersection portion D. As a result of this process, the protective film 2 is fabricated as shown in FIG. 2. In addition, the insulation film 103 is photoetched by use of a third photoresist mask. In this step, the insulation film 103 is removed from regions associated with a portion of the scanning line 10, the terminal section E, and the pixel electrode B, the processed area being slightly narrower than the respective section. Third, as can be seen from (c) of FIG. 1, the semiconductor 104 is processed by use of a fourth photoresist mask such that the semiconductor 104 is kept to be broader than a width of the gate electrode 11 in a direction of a channel length and to be shorter than the gate electrode 11 in a direction of a channel width, and that the semiconductor 104 is also kept in the wiring intersection portion D. Fourth, as shown in (d) of FIG. 1, there is formed a doped semiconductor film 106 containing impurity, for example, an amorphous silicon film with a thickness of 50 nm and containing phosphorus with a concentration of 0.6%, by use of the CVD method. Subsequently, an upper conductor film (I) 107 is formed, for example, a chromium film having a thickness of 70 nm, through a sputtering operation and then an upper conductor film (II) 108 is produced, for example, an aluminum film having a thickness of 350 nm, by sputtering. Thereafter, these three layers are subjected to a etching process by use of a fifth photoresist mask. In this process, in the thin-film transistor section A, the three layers are kept in association with a drain electrode 51 and a source electrode 52; in the pixel electrode section B, the three layers are removed from regions other than a contact section of the source electrode 52, and then the lower electrode film 102 is subsequently removed; in the additional capacity section C, the additional capacity upper electrode 53 is kept and then the signal line 50 is kept so as to cover a contact hole 4 over the scanning line 10 to establish an electric connection; furthermore, the signal line 50 is kept. In the wiring intersection portion D, the two-layer wiring is formed. Furthermore, in the terminal section E, the photoetching of the three films is carried out such that the transparent conductor film 101 appears in an external connection section, thereby attaining a panel shown in (d) of FIG. 1 and FIG. 2. Thereafter, a passivation film and an orientation film are fabricated as necessary. In the third embodiment, five photoresist masks are employed for the production.

Embodiment 4

Figure 6:
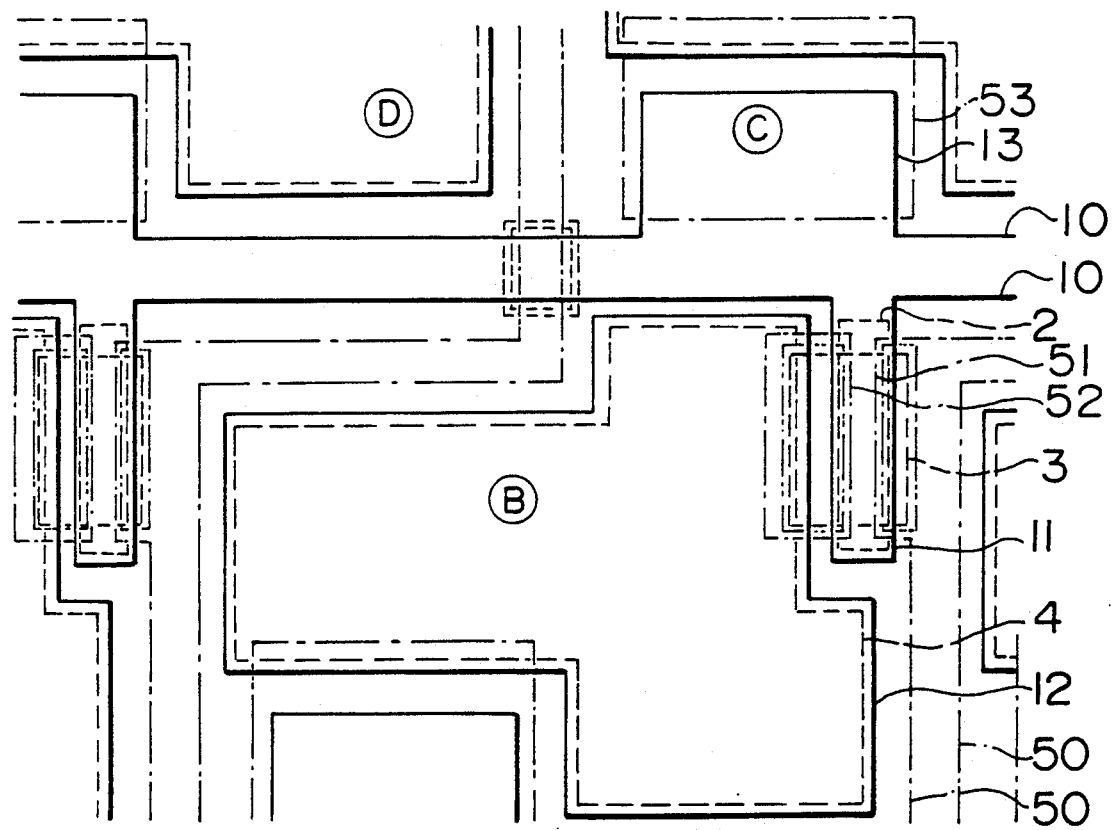
FIG. 6 is a plan view showing a panel of FIG. 5(d)
Figure 7:
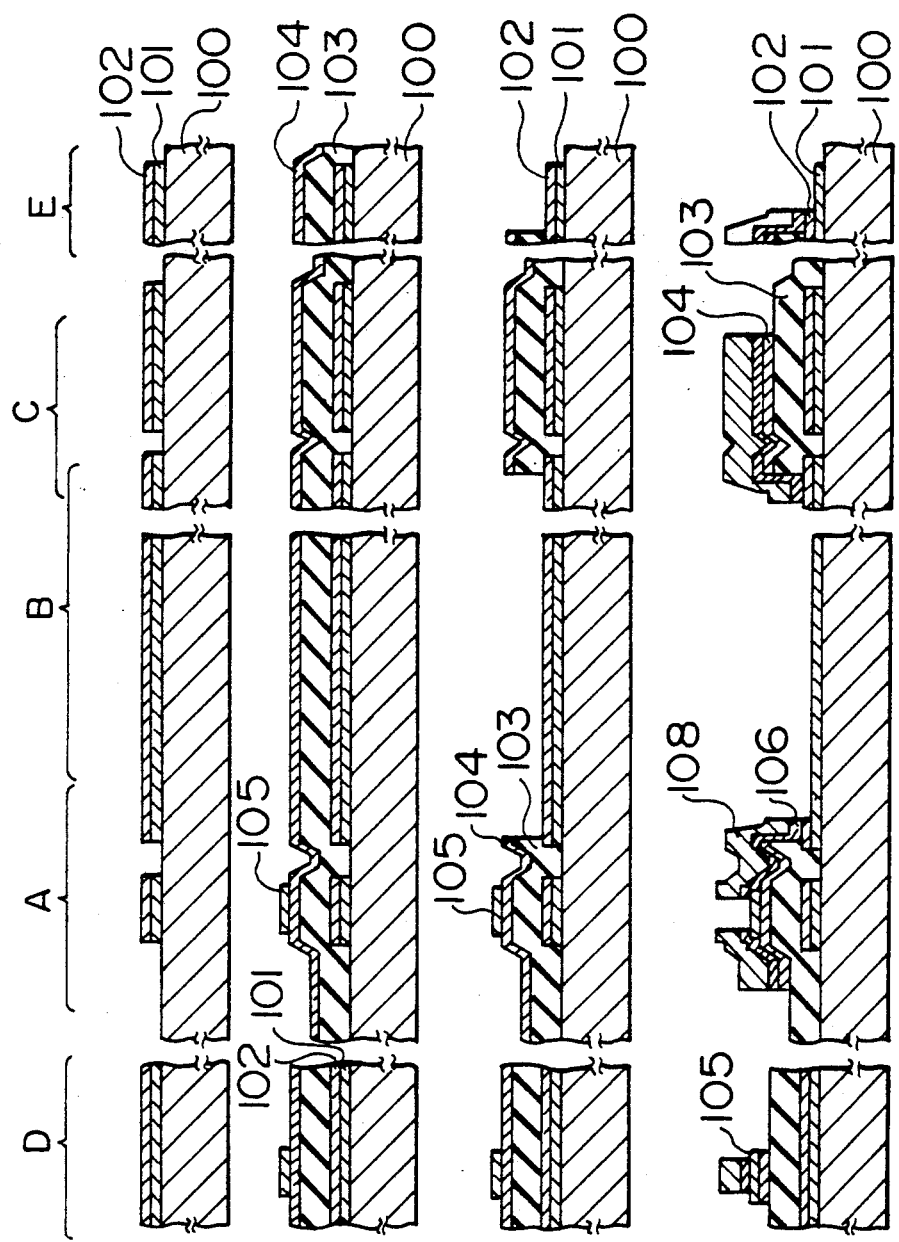
FIGS. 7a-7d are schematic diagrams showing a process flow useful to explain a fifth embodiment according to the present invention.
Figure 8:
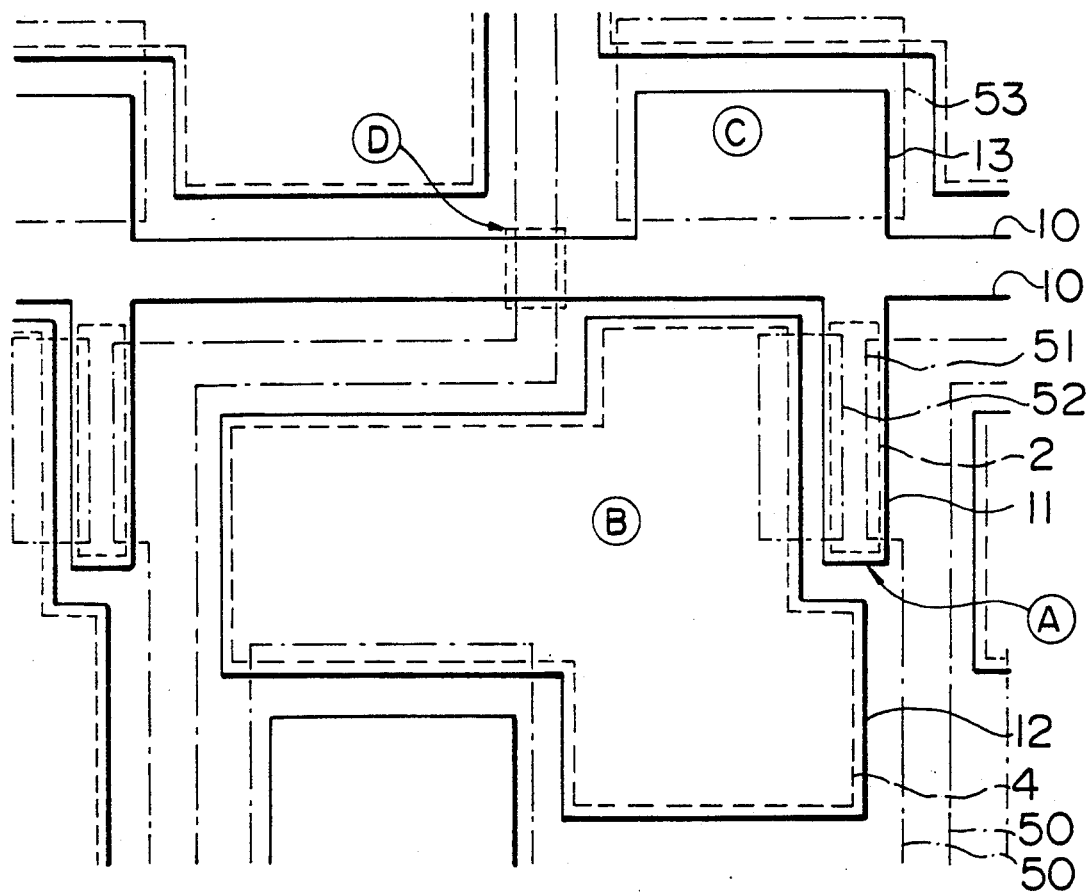
FIG. 8 is a plan view showing a panel of FIG. 7(d)
Figure 9:
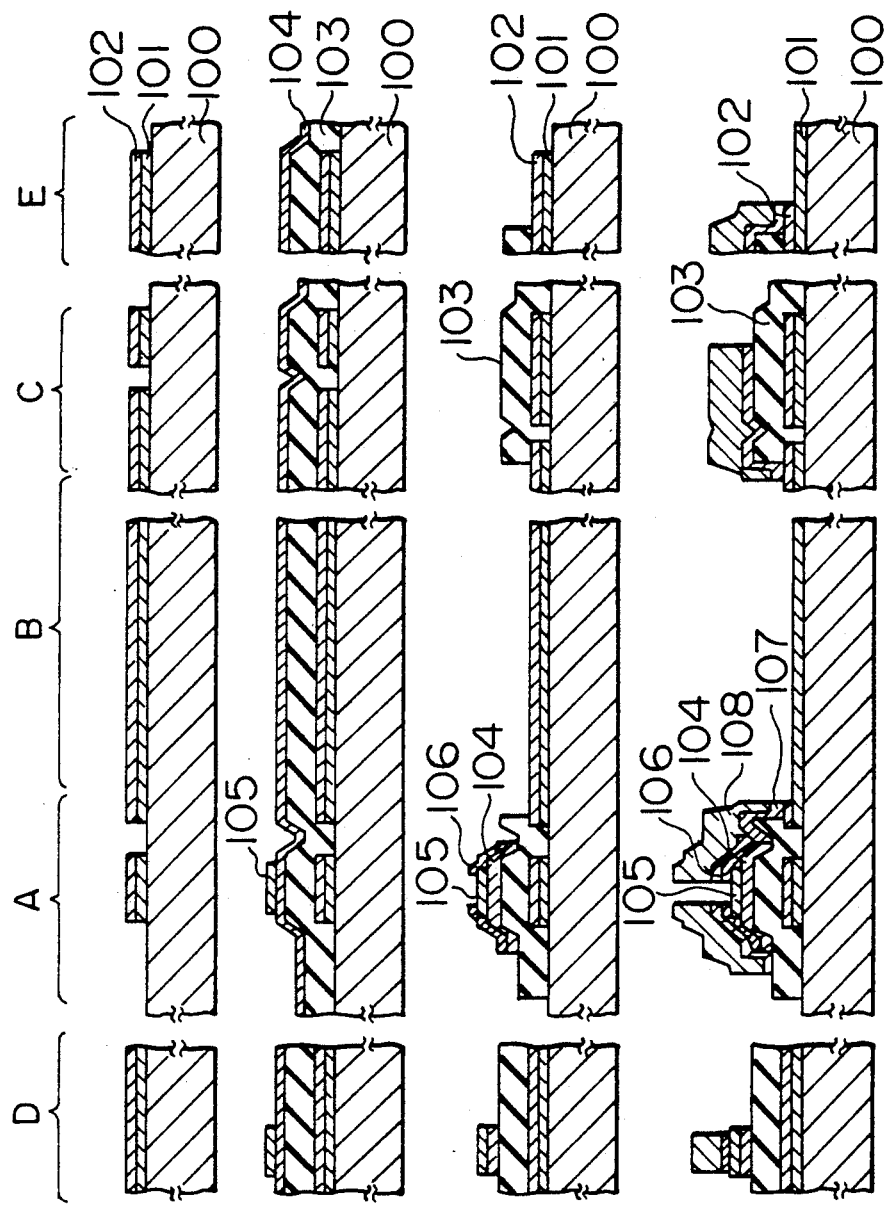
FIGS. 9a-9d are schematic diagrams showing a process flow useful to explain a seventh embodiment according to the present invention.

Description will be given of the fourth embodiment according to the present invention with reference to FIGS. 5a–5d and FIG. 6. First, as shown in (a) of FIG. 5, on a glass substrate 100, there is formed as a transparent conductor film 101, for example, a film of ITO with a film thickness of 100 nm and then a lower conductor film 102 is formed thereon, for example, a chromium film having a thickness of 60 nm. These two films undergo an ordinary etching process by use of a sheet of photoresist mask. Through this work process, there are formed in the thin-film transistor section A a gate electrode 11 (FIG. 6), a pixel electrode 12, a scanning line 10, and an additional capacity lower electrode 13. Second, as shown in (b) of FIG. 5, by use of the chemical vapor deposition (CVD), method, there are formed and insulation film 103, for example, a film of SiN having a thickness of 350 nm, a semiconductor layer 104, for example, of an amorphous silicon with a thickness of 60 nm, and a protection film 105, for example, a SiN film having a thickness of 300 nm. Thereafter, the protective film 105 is by use of a second photoresist mask. In this work process, the protective film 105 is kept so as to have a width narrower than the width of the gate electrode 11 of the thin-film transistor portion A; moreover, the protective film 105 is retained in the wiring intersection portion D. As a result of this process, the protective film 2 is fabricated as shown in FIG. 6. Third, as can be seen from (c) of FIG. 5, the semiconductor 104 is processed by use of a third photoresist mask such that the semiconductor 104 is kept to be broader than a width of the gate electrode 11 in a direction of a channel length and to be shorter than the gate electrode 11 in a direction of a channel width, and that the semiconductor 104 is also kept in the wiring intersection portion D. Furthermore, the insulation film 103 is photoetched by means of a fourth mask. In this process, the insulation film 103 is removed from the regions associated with the terminal section E and the pixel electrode section B, the processed areas being slightly narrower than the respective sections. Fourth, as shown in (d) of FIG. 5, there is formed a doped semiconductor film 106 containing impurity, for example, an amorphous silicon film with a thickness of 50 nm and containing phosphorus with a concentration of 1% according to the CVD method, and then the doped semiconductor film 106 containing impurity is subjected to an etching by use of a fifth photoresist mask. In this process, the doped semiconductor film 106 is reduced to be smaller than the source and drain electrode patterns in the thin-film transistor section A and so as to cover a portion of the step section of the amorphous silicon semiconductor film 104 and a portion of the protective film 105. Subsequently, an upper conductor film (I) 107 is formed, for example, a chromium film having a thickness of 60 nm, through a sputtering operation, and then an upper conductor film (II) 108 is produced, for example, an aluminum film having a thickness of 500 nm, by sputtering. Thereafter, these two layers are subjected to an etching process by use of a sixth photoresist mask. In this process, in the thin-film transistor section A, two layers are kept in regions associated with a drain electrode 51 and a source electrode 52; in the pixel electrode section B, the two layers are removed from regions other than a contact section of the source electrode 52 and a contact section of the additional capacity C and then the lower electrode film 102 is subsequently removed; in the additional capacity section C, the additional capacity upper electrode 53 is kept and then the signal line 50 is retained; and in the wiring intersection portion D, the two-layer wiring is formed. Furthermore, in the terminal section E, the work process of the two films is carried out such that the transparent conductor film 101 appears in an external connection section, thereby attaining a panel shown in (d) of FIG. 5 and FIG. 6. In the fourth embodiment, six photoresist masks are employed for the production.

Embodiment 5

Description will be given of the fifth embodiment according to the present invention with reference to FIGS. 7a–FIG. 7d and FIG. 8. First, as shown in (a) of FIG. 7, on a glass substrate 100, there is fabricated as a transparent conductor film 101, for example, an ITO film with a film thickness of 60 nm, and then a lower conductor film 102 is formed thereon, for example, a chromium film having a thickness of 80 nm. These two films are subjected to an ordinary etching process by use of a photoresist mask. Through this work process, there are formed in the thin-film transistor section A a gate electrode 11 (FIG. 8), a pixel electrode 12, a scanning line 10, and an additional capacity lower electrode 13. Second, as shown in (b) of FIG. 7, by use of a chemical vapor deposition (CVD) method, there are formed an insulation film 103, for example, a film of SiN having a thickness of 250 nm, a semiconductor layer 104, for example, of an amorphous silicon with a thickness of 20 nm, and a protection film 105, for example, a SiN film having a thickness of 200 nm. Thereafter, the protective film 105 is etched by use of a second photoresist mask. In this work process, the protective film 105 is kept so as to have a width narrower than the width of the gate electrode 11 of the thin-film transistor portion A; moreover, the protective film 105 is retained also in the wiring intersection portion D. As a result of this process, there is fabricated the protective film 2 of FIG. 8. Third, as can be seen from (c) of FIG. 7, the film of the semiconductor 104 and the insulation film 103 are processed such that the semiconductor film 104 and the insulation film 103 are removed from regions associated with the terminal section E and the pixel electrode section B, the processed regions being slightly narrower than the respective sections. Fourth, as shown in (d) of FIG. 7, there is formed a doped semiconductor film 106 containing impurity, for example, an amorphous silicon film with a thickness of 50 nm and containing phosphorus with a concentration of 1% by use of the CVD method. Subsequently, an upper conductor film (II) 108 is produced, for example, an aluminum film having a thickness of 300 nm, by sputtering, and then these two layers are subjected to a photoresist etching process by use of a fourth photoresist mask. In this process, in the thin-film transistor section A, a drain electrode 51 and a source electrode 52 are kept in the pixel electrode section B, the two layers are removed from regions other than a contact section of the source electrode 52 and a contact section of the additional capacity C; in the additional capacity section C, the additional capacity upper electrode 53 is kept and then the signal line 50 is kept; and in the wiring intersection portion D, the two-layer wiring is configured. After the work process is finished on the two-layer film including upper conductor film (II) 108 and the doped semiconductor film 106, the semiconductor film 104 is subsequently processed and then the lower conductor film 102 is removed from regions over the pixel electrode section B and the terminal section E; thereby attaining a panel shown in (d) of FIG. 7 and FIG. 8. In the seventh embodiment, four photoresist masks are employed for the fabrication.

In the first to fifth embodiments described above, the lower conductor film 102, the upper conductor film (I) 107 (which is not formed in the fifth embodiment; however, it is to be understood that the fabrication of the fifth embodiment also applies even if the upper conductor film (I) is added), and the upper conductor film (II) 108 are respectively manufactured by use of a chromium film, a chromium film, and an aluminum film; however, the present invention is not specifically restricted by those materials. In addition, the present invention is not restricted by other features, for example, the presence and absence of the upper conductor film (I) 107 and the connecting method of the additional capacity, namely, whether the additional capacity upper electrode 53 is connected to the pixel electrode 12 or to the scanning line 10. That is, such features can be arbitrarily selected when necessary. Furthermore, it is also possible to set the size of the pattern of the semiconductor film 104 to be narrower than the width of the gate electrode 11.

Embodiment 6

Description will be given of the sixth embodiment according to the present invention with reference to FIGS. 3a–3d and FIG. 4. First, as shown in (a) of FIG. 3, on a glass substrate 100, there is manufactured as a transparent conductor film 101, for example, an ITO film with a film thickness of 80 nm and then a lower conductor film 102 is piled thereon, for example, a chromium film having a thickness of 100 nm. These two films undergo an ordinary etching process by use of a photoresist mask. Through this work process, in the thin-film transistor section A, there are formed a gate electrode 11 (FIG. 4), a pixel electrode 12, a scanning line 10, and an additional capacity lower electrode 13. Second, as shown in (b) of FIG. 3, applying the chemical vapor deposition (CVD) method, there are formed an insulation film 103, for example, a film of SiN having a thickness of 300 nm, a semiconductor layer 104, for example, of an amorphous silicon with a thickness of 200 nm, and a protection film 105 piled thereon. The protection film 105 is formed in one of the following methods. That is, (1) a chemical vapor deposition (CVD) is conducted by use of $SiH_4$, $NH_3$, and $O_2$ as the primary constituent elements so as to accumulate $Si_XO_YN_Z$ (the values of X, Y, and Z change depending on the CVD conditions) with a film thickness of 200 nm, (2) $Si_XN_Y$ (the values of X and Y change depending on the CVD conditions) is first piled and then $Si_XO_Y$ is accumulated thereon by use of $SiH_4$ and $O_2$ as the primary constituent elements, thereby producing a two-layer film, (3) $Si_XO_Y$ is piled by use of the CVD method, (4) first, a film of $Si_XN_Y$ is accumulated and then the film is subjected to a discharge processing in an atmosphere of oxygen under a decreased pressure. Thereafter, the protective film 105 thus attained is worked through an etching process by use of a second photoresist mask. In this work process, the protective film 105 is kept so as to have a width narrower than the width of the gate electrode 112 of the thin-film transistor portion A; moreover, the protective film 105 is retained also in the wiring intersection portion d. As a result of this process, the protective film 2 is fabricated as shown in FIG. 4. Third, as can be seen from (c) of FIG. 3, the semiconductor film 104 is processed by use of a third photoresist mask such that the semiconductor film 104 is kept to be broader than a width of the gate electrode 11 in a direction of a channel length and to be shorter than the gate electrode 11 in a direction of a channel width, and that the semiconductor film 104 is also kept in the wiring intersection portion D. Moreover, a work process is carried out on the insulation film 103 by use of a fourth photoresist mask such that the insulation film 103 is removed from regions related to the terminal section E and the pixel electrode section B, the processed regions being slightly narrower than the respective sections. Fourth, as shown in (d) of FIG. 3, there is formed a doped semiconductor film 106 containing an impurity, for example, an amorphous silicon film with a thickness of 50 nm and containing phosphorus with a concentration of 1%, by use of the CVD method. Subsequently, an upper conductor film (I) 107 is formed, for example, a chromium film having a thickness of 100 nm, through a sputtering operation, and then an upper conductor film (II) 108 is produced, for example, an aluminum film having a thickness of 500 nm, by sputtering. Thereafter, these three layers are subjected to an etching process by use of a fifth photoresist mask. In this process, in the thin-film transistor section A, the three layers are kept in regions associated with a drain electrode 51 and a source electrode 52; in the pixel electrode section B, the three layers are removed from a region other than a contact section of the source electrode 52, and then the lower electrode film 102 is subsequently removed; and in the additional capacity section C, the additional capacity upper electrode 53 is kept, and then the signal line 50 is kept. In the wiring intersection portion D, the two-layer wiring is formed. Furthermore, in the terminal section E, the work process of the three films is carried out such that the transparent conductor film 101 appears in an external connection section. Incidentally, when the doped semiconductor film 106 is processed by use of a gas, for example, a Freon gas, the protective film 105 is reduced to some extent in the embodiments above; however, the protective film 105 of the sixth embodiment includes a compound of silicon and oxygen and hence is resistive against such a Freon gas, which enables the doped semiconductor film 106 to be worked almost without reducing the protective film 105. In this manner, there is attained a panel shown in (d) of FIG. 3 and FIG. 4. In the sixth embodiment, five photoresist masks are employed for the production.

Embodiment 7

Figure 10:
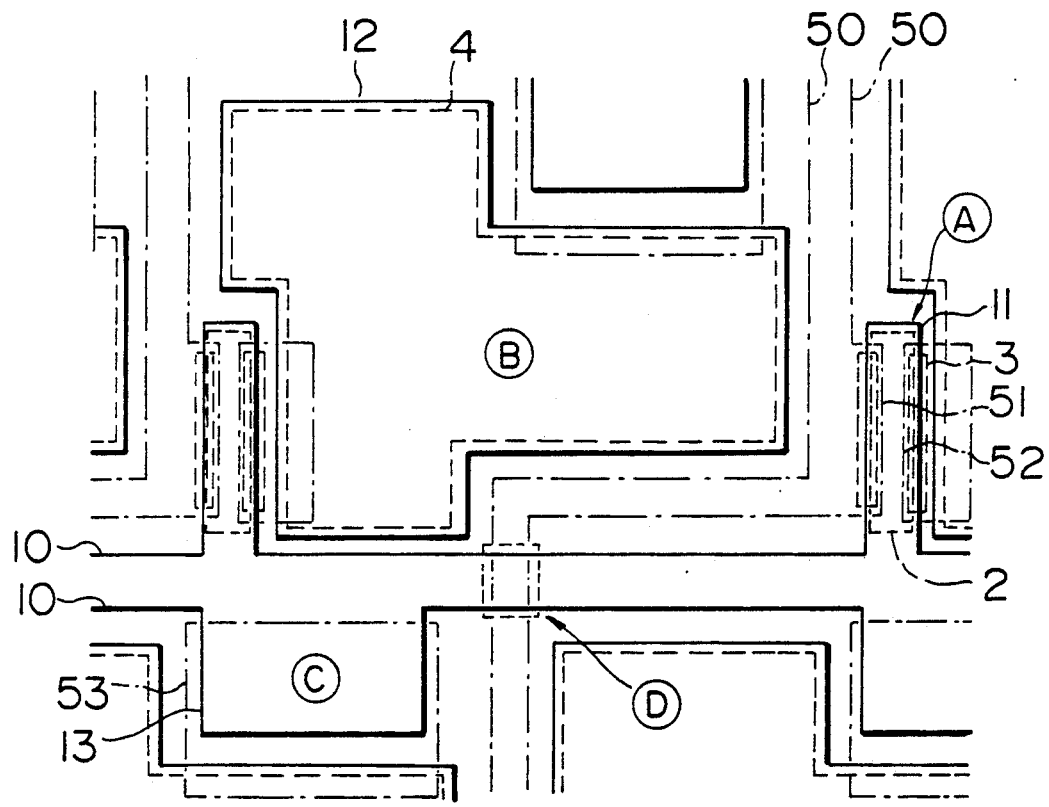
FIG. 10 is a plan view showing a panel of FIG. 9(d).

Description will be given of the seventh embodiment according to the present invention with reference to FIGS. 9a-9d and FIG. 10. First, as shown in (a) of FIG. 9, on a glass substrate 100, there is formed as a transparent conductor film 101, for example, a film of ITO with a film thickness of 80 nm, and then a lower conductor film 102 is formed thereon, for example, a chromium film having a thickness of 100 nm. These two films are subjected to an ordinary etching process by use of a photoresist mask. Through this work process, there are formed in the thin-film transistor section A a gate electrode 11 (FIG. 10), a pixel electrode 12, a scanning line 10, and an additional capacity lower electrode 13. Second, as shown in (b) of FIG. 9, by use of the chemical vapor deposition (CVD) method, there are formed an insulation film 103, for example, a film of SiN having a thickness of 300 nm, a semiconductor layer 104, for example, of an amorphous silicon with a thickness of 50 nm, and a protection film 105, for example, a $Si_xO_yN_z$ film having a thickness of 350 nm. Thereafter, the protective film 105 is worked through an etching process by use of a second photoresist mask. In this work process, the protective film 105 is kept so as to have a width narrower than the width of the gate electrode 11 of the thin-film transistor portion A; moreover, the protective film 105 is retained in the wiring intersection portion D. As a result of this process, the protective film 2 is fabricated as shown in FIG. 10. Third, as can be seen from (c) of FIG. 9, the insulation film 103 is processed by use of a third photoresist mask such that the insulation film 103 is removed from regions associated with the terminal section E and the pixel electrode section B, the processed areas being slightly narrower than the respective sections. Next, applying the CVD method, there is formed a doped semiconductor film 106 containing impurity, for example, an amorphous silicon film having a film thickness of 50 nm and containing phosphorus with a concentration of 1%; thereafter, the doped semiconductor film 106 is processed so as to be narrower than the source and drain electrodes and to be removed from a region associated with a central portion of the protection film 105; and then a work process is carried out on the semiconductor film 104. Fourth, as shown in (d) of FIG. 9, an upper conductor film (I) 107 is fabricated, for example, a chromium film having a thickness of 60 nm, through a sputtering operation, and then an upper conductor film (II) 108 is produced, for example, an aluminum film having a thickness of 500 nm, by sputtering. Thereafter, these two layers are subjected to an etching process by use of a fifth photoresist mask. In this process, in the thin-film transistor section A, two layers are kept in regions associated with a drain electrode 51 and a source electrode 52; in the pixel electrode section B, the two layers are removed from regions other than a contact section of the source electrode 52, and then the lower electrode film 102 is subsequently removed; in the additional capacity section C, the additional capacity upper electrode 53 is kept, and then the signal line 50 is also kept; and in the wiring intersection portion D, there is formed a two-layer wiring. Furthermore, in the terminal section E, the work process of the two films is conducted such that the transparent conductor film 101 appears in an external connection section. As a result, there is attained a panel shown in (d) of FIG. 9 and FIG. 10. In the seventh embodiment, five photoresist masks are employed for the production.

According to the first to seventh embodiments described above, since the number of photoresist masks required for the fabrication is reduced, the panel work process is simplified; moreover, according to this method, the metal film which is formed for the gate electrode and which is disposed on the transparent conductor film for the pixel electrode is simultaneously removed when the final process of the source and drain electrodes is carried out. In consequence, there is attained an advantage that the metal film serves as a protective film of the transparent conductor at intermediate points of the process. In addition, since an opaque portion is retained in the periphery of the pixel electrode, a light interruption is effected in an unstable portion of a liquid crystal in the neighborhood of the pixel, which leads to an effect that a uniform transmittivity is developed for the pixel associated with an image signal. Furthermore, according to the sixth and seventh embodiments, between the amorphous silicon semiconductor film 104 piled on the gate insulation film 103 over a portion of the channel section and the doped semiconductor film 106 formed to establish a contact between the semiconductor film 104 and the source and drain electrodes, there is fabricated in this method a protection film 105; in consequence, it is advantageously possible to attain a high resistivity against a Freon gas in the work of the doped semiconductor and the amorphous silicon semiconductor.

While particular embodiments of the invention have been shown and described, it will be obvious to those skilled in the art that various changes and modifications may be made without departing from the present invention in its broader aspects.

We claim:

1. An active matrix panel manufacturing method of manufacturing a liquid-crystal panel of an active matrix type wherein a two-layer film including a transparent conductor film and a metal film sequentially accumulated on a substrate is subjected to a work such that a pattern creation is simultaneously carried out at least at a location of a pixel electrode and at a location of a gate electrode of a thin-film transistor; wherein the metal film at the location of the pixel electrode is removed in a same working step, using a same mask, as a step of producing a source electrode and drain electrode of the thin-film transistor, the transparent conductor film forming the pixel electrode; and wherein a gate insulating film of the thin-film transistor is formed so as to extend to a position on the pixel electrode.

2. An active matrix panel manufacturing method of manufacturing a liquid-crystal panel of an active matrix type wherein a two-layer film including a transparent conductor film and a metal film sequentially accumulated on a substrate is subjected to a work such that a pattern creation is simultaneously carried out at least at a location of a pixel electrode and at a location of a gate electrode of a thin-film transistor; wherein an unnecessary portion of a doped amorphous silicon film, which contains an impurity and which is accumulated on a side of a lower layer of a source wiring of the thin-film transistor, and the metal film at the location of the pixel electrode are removed in a same working step, using a same mask, as a step of producing a source electrode and a drain electrode of the thin-film transistor, the transparent conductor film forming the pixel electrode; and wherein a gate insulating film of the thin-film transistor is formed so as to extend to a position on the pixel electrode.

3. An active matrix panel manufacturing method of manufacturing a liquid-crystal panel of an active matrix type wherein a two-layer film including a transparent conductor film and a metal film sequentially accumulated on a substrate is subjected to a work such that a pattern creation is simultaneously carried out at least at a location of a pixel electrode and at a location of a gate electrode of a thin-film transistor; wherein an unnecessary portion of a doped amorphous silicon film, which contains an impurity and which is accumulated on a side of a lower layer of a source wiring of the thin-film transistor, an unnecessary portion of an amorphous silicon film accumulated on a side of a lower layer of the doped amorphous silicon film and on a side of an upper layer of a gate insulation film, and the metal film at the location of the pixel electrode are removed in a same working step, using a same mask, as a step of producing a source electrode and a drain electrode of the thin-film transistor, the transparent conductor forming the pixel electrode, and wherein a gate insulating film of the thin-film transistor is formed so as to extend to a position on the pixel electrode.

4. An active matrix panel manufacturing method according to claim 1, wherein said pixel electrode includes the transparent conductor film in a central portion thereof and a two-layer film constituted by the transparent conductor film and the metal film in a periphery portion thereof.

5. An active matrix panel manufacturing method according to claim 2, wherein said pixel electrode includes the transparent conductor film in a central portion thereof and a two-layer film constituted by the transparent conductor film and the metal film in a periphery portion thereof.

6. An active matrix panel manufacturing method according to claim 3, wherein said pixel electrode includes the transparent conductor film in a central portion thereof and a two-layer film constituted by the transparent conductor film and the metal film in a periphery portion thereof.

7. An active matrix panel manufacturing method according to claim 3 wherein between said doped amorphous silicon film and said amorphous silicon film, there is disposed a protective film which comprises silicon as a primary component and which further comprises a compound at least including oxygen.

8. An active matrix panel manufacturing method according to claim 4 wherein between said doped amorphous silicon film and said amorphous silicon film, there is disposed a protective film which comprises silicon as a primary component and which further comprises a compound at least including oxygen.

9. An active matrix panel manufacturing method according to claim 1, wherein said work simultaneously producing the pixel electrode and the gate electrode and said work forming the source and drain electrodes are photoetching steps which are achieved by photolithography through use of photoresist masks.

10. An active matrix panel manufacturing method according to claim 2, wherein said work simultaneously producing the pixel electrode and the gate electrode and said work forming the source and drain electrodes are photoetching steps which are achieved by photolithography through use of photoresist masks.

11. An active matrix panel manufacturing method according to claim 3, wherein said work simultaneously producing the pixel electrode and the gate electrode and said work forming the source and drain electrodes are photoetching steps which are achieved by photolithography through use of photoresist masks.

12. A method of manufacturing an active matrix panel having at least a thin-film transistor section and a pixel electrode section, comprising:
a first step in which a transparent conductor film is accumulated on a glass substrate and then a lower conductive film is formed on the transparent conductor film such that a two-layer film including the transparent conductor film and the lower conductor film is formed, and the two-layer film is subject to photoetching so as to form a gate electrode of the thin-film transistor section and a pixel electrode of the pixel electrode section;
a second step in which an insulator film, a semiconductor film, and a protective film are sequentially accumulated in this order, and the protective film is subjected to photoetching so as to be narrower than a width of the gate electrode of the thin-film transistor section, thereby forming a protective layer;
a third step in which the insulator film is subjected to photoetching so as to form a gate insulator of the thin-film transistor section, and the semiconductor film is subjected to photoetching so as to be broader than the width of the gate electrode in a direction of a channel length and to be shorter than the gate electrode in a direction of a channel width; and
a fourth step in which a doped semiconductor film containing an impurity, a first upper conductor film, and a second upper conductor film are sequentially accumulated in this order so as to form a three-layer film comprising the doped semiconductor film, the first upper conductor film, and the second upper conductor film, and the three-layer film is subjected to photoetching so as to form a drain electrode and a source electrode of the thin-film transistor section, and the three-layer film is removed from regions over the pixel electrode section, said regions being other than a contact portion between either one of the drain electrode and the source electrode and the pixel electrode, and wherein the lower conductor film is removed over the pixel electrode section.

13. A method of manufacturing an active matrix panel having at least a thin-film transistor section and a pixel electrode section, comprising:
a first step in which a transparent conductor film is accumulated on a glass substrate, a lower conductor film is formed on the transparent conductor film such that a two-layer film including the transparent conductor film and the lower conductor film is formed, and the two-layer film is subjected to photoetching so as to form a gate electrode of the thin-film transistor section and a pixel electrode of the pixel electrode section;
a second step in which an insulator film, a semiconductor film, and a protective film are sequentially accumulated in this order, and the protective film is subjected to photoetching so as to be narrower than a width of the gate electrode of the thin-film transistor section, thereby forming a protective layer;

a third step in which the semiconductor film and the insulator film are removed from a region associated with the pixel electrode section, said region being slightly narrower than the pixel electrode section; and a fourth step in which a doped semiconductor film containing an impurity and an upper conductor film are sequentially accumulated in this order, so as to form a two-layer film comprising the doped semiconductor film and the upper conductor film, and the two-layer film is subjected to photoetching so as to form a drain electrode and a source electrode of the thin-film transistor section and to remove the two-layer film from regions over the pixel electrode section, said regions being other than a contact portion between either one of the drain electrode and the source electrode and wherein the semiconductor film is subsequently subjected to photoetching so as to remove the lower conductor film in a region over the pixel electrode section.

14. A method of manufacturing an active matrix panel having at least a thin-film transistor section and a pixel electrode section, comprising:

a first step in which a transparent conductor film is accumulated on a glass substrate, a lower conductor film is formed on the transparent conductor film such that a two-layer film is formed, and the two-layer film is subjected to photoetching so as to form a gate electrode of the thin-film transistor section and a pixel electrode of the pixel electrode section;

a second step in which an insulator film, a semiconductor film, and a protective film including $Si_xO_yN_z$ are sequentially accumulated in this order, and the protective film is subjected to photoetching so as to be narrower than a width of the gate electrode in the thin-film transistor section, thereby forming a protection layer;

a third step in which the insulator film is removed from a region associated with the pixel electrode section, said region being slightly narrower than the pixel electrode section; and in which a doped semiconductor containing an impurity is accumulated, and is subjected to photoetching so as to be smaller than the source and drain electrodes in the thin-film transistor section and so as to remove a central portion thereof in the pixel electrode section, and that thereafter the semiconductor film undergoes photoetching in a successive fashion; and a fourth step in which a first upper conductor film and a second upper conductor film are sequentially accumulated in this order to form a two-layer film comprising the first and second upper conductor films, and the two-layer film is subjected to photoetching so as to form a drain electrode and a source electrode of the thin-film transistor section and to remove the two-layer film from regions over the pixel electrode section, said regions being other than a contact portion between either one of the drain electrode and the source electrode and the pixel electrode, and that thereafter the lower conductor film is removed.

15. A method of manufacturing an active matrix panel having at least a thin-film transistor section and a pixel electrode section, comprising:

a first step for accumulating a transparent conductor film on a glass substrate and forming a lower conductor film on the transparent conductor film, and photoetching so as to form a gate electrode of the thin-film transistor section and a pixel electrode of the pixel electrode section;

a second step for accumulating a gate insulator film, an amorphous silicon film, and a protective film in this order, and photoetching the protective film so as to form a protective layer;

a third step for removing the amorphous silicon film and the gate insulator film from the pixel electrode section; and a fourth step for accumulating an impurity-doped semiconductor film and an upper conductor film in this order, and photoetching so as to form a drain electrode and a source electrode of the thin-film transistor section, to remove the impurity-doped semiconductor film and the upper conductor film from the pixel electrode, and to remove the lower conductor film from the pixel electrode section.

16. An active matrix panel manufacturing method according to claim 1, wherein one of said source electrode and said drain electrode is formed to extend over a part of the gate insulating film extending to a position on the pixel electrode, and to come into electrical contact with said pixel electrode.

17. An active matrix panel manufacturing method according to claim 2, wherein one of said source electrode and said drain electrode is formed to extend over a part of the gate insulating film extending to a position on the pixel electrode, and to come into electrical contact with said pixel electrode.

18. An active matrix panel manufacturing method according to claim 3, wherein one of said source electrode and said drain electrode is formed to extend over a part of the gate insulating film extending to a position on the pixel electrode.

19. A method of manufacturing an active matrix panel according to claim 12, wherein the gate insulator, formed by photoetching the insulator film, is formed so as to extend on the pixel electrode.

* * * * *